United States Patent [19]

Oi et al.

[11] 4,365,155
[45] Dec. 21, 1982

[54] SCINTILLATOR WITH $ZnWO_4$ SINGLE CRYSTAL

[75] Inventors: Tetsu Oi, Tokyo; Kazumasa Takagi, Hinodemachi; Tokuumi Fukazawa, Tachikawa, all of Japan

[73] Assignee: Hitachi, Ltd., Tokyo, Japan

[21] Appl. No.: 132,132

[22] Filed: Mar. 20, 1980

[30] Foreign Application Priority Data

Mar. 28, 1979 [JP] Japan .................................. 54-35463

[51] Int. Cl.³ ............................................. C09K 11/12
[52] U.S. Cl. .................................... 378/49; 250/367;
252/62.3 ZT; 252/301.17; 252/301.18;
428/409; 378/4; 378/6
[58] Field of Search .............. 156/DIG. 69, DIG. 77;
252/62.3 ZT, 515, 301.5, 301.6 R, 600, 301.17,
301.18, ; 428/156, 172, 35, 409, 220; 250/272,
321, 367

[56] References Cited

U.S. PATENT DOCUMENTS 3,960,756 6/1976 Noakes ........................... 252/301.18

OTHER PUBLICATIONS

Van Vitert et al., "Single Crystal Tungstates for Resonance and Emission Studies," Feb. 1960, vol. 31, No. 2, pp. 328, 329, 330.

Primary Examiner—Marion McCamish
Attorney, Agent, or Firm—Antonelli, Terry and Wands

[57] ABSTRACT

A scintillator formed of a $ZnWO_4$ single crystal having an absorption coefficient less than or equal to 1.8 cm$^{-1}$ for the light having a wavelength of 520 nm is disclosed which has a luminescence wavelength of 480 nm and therefore can be combined with a photodiode, and which is high in radiation detection sensitivity, short in decay time, and specifically suitable for use in computed tomography.

14 Claims, 4 Drawing Figures

SCINTILLATOR WITH ZnWO₄ SINGLE CRYSTAL

The present invention relates to a scintillator for converting such radiation as X-rays or γ-rays into light, and more particularly to a scintillator suitable for use in computed tomography employing the above radiation and to a method for producing the scintillator.

In recent years, computed tomography have been actively and largely developed in which an object is irradiated with and scanned by a sharp X-ray beam in various directions, the X-rays having passed through the object on each scanning line are detected, the detected X-ray intensities are sent to a computer to calculate the X-ray absorption coefficient at each point on a matrix pattern, and a tomography having a light and dark pattern corresponding to a distribution of the calculated X-ray absorption coefficient is formed.

The scintillator employed in such computed tomography is made of a material which contains an element having a large atomic number Z at a high density, and there have been hitherto known such materials as NaI (containing Tl), CsI, $Bi_4Ge_3O_{12}$, $CaWO_4$ and $CdWO_4$. However, these materials have not been able to form an excellent crystal serving as the scintillator of the computed tomography.

In more detail, it is now desired that the scintillator used in the computed tomography is not only high in X-ray detection sensitivity but also short in decay time, and moreover the luminescence wavelength thereof lies within a longer wavelength range corresponding to the detectable wavelength range of a photo-diode used, since the X-ray beam conducts a scanning operation and a photomultiplier for detecting the light output of the scintillator is being replaced by a photo-diode.

The above-mentioned materials have various drawbacks, as itemized below and summarized in the following table 1. (1) A scintillator made of $Bi_4Ge_3O_{12}$ has an X-ray detection sensitivity equal to only 12 percent of that of a scintillator made of NaI containing Tl (hereinafter referred to as NaI (Tl)). (2) A scintillator made of $CaWO_4$ has a luminescence wavelength of 430 nm and therefore is disadvantageous when combined with a photo-diode capable of detecting light rays within the longer wavelength range. (3) A scintillator made of $CdWO_4$ contains the element Cd producing pollution, and is high in cost for the reason that an anti-pollution measure has to be taken in fabricating the scintillator.

Incidentally, the X-ray detection sensitivity of a scintillator is herein expressed by a ratio (or percent) of the X-ray detection sensitivity of the above scintillator to that of the NaI (Tl) scintillator having the highest sensitivity.

TABLE 1

| Material | Effective atomic number | Density (g/cm³) | X-ray detection sensitivity (%) | Luminescence wavelength (nm) |
|---|---|---|---|---|
| $Bi_4Ge_3O_{12}$ | 56 | 7.1 | 12 | 480 |
| $CaWO_4$ | 47 | 6.1 | 50 | 430 |
| $CdWO_4$ | 41 | 7.9 | 65 | 480 |
| NaI(Tl) | 42 | 3.7 | 100 | 410 |

The following references are cited to show the state of the art: (i) R. H. Gillette; Rev. Sci. Instrum., Vol. 21, P. 294 (1950), (ii) P. A. C. Whiffin et al.; J. Crystal Growth, Vol. 10, P. 91 (1971), and (iii) R. A. M. Scott; J. Crystal Growth, Vol. 10, P. 39 (1971).

A main object of the present invention is to provide a scintillator which can overcome the above-mentioned drawbacks of the conventional scintillators, is suitable for use in computed tomography in respect of X-ray detection sensitivity, luminescence wavelength and afterglow characteristics, and can preclude the the possibility of pollution; and further is to provide a method for producing such a scintillator.

In order to attain the above object, a scintillator according to the present invention is formed of a single crystal of $ZnWO_4$. In more detail, a $ZnWO_4$ single crystal according to the present invention has an absorption coefficient not more than 1.8 cm$^{-1}$, preferably not more than 1.2 cm$^{-1}$, more preferably not more than 0.5 cm$^{-1}$ and most preferably not more than 0.21 cm$^{-1}$ for light having a wavelength of 520 nm.

Though the shape and size of the scintillator, as is well-known, is varied with the method for detecting radiation, facing surfaces of the scintillator, upon one of which the radiation impinges, are usually made parallel to the (010) plane of a crystal forming the scintillator. Further, the scintillator can have various thicknesses in dependence upon the energy of incident radiation and the object of measurement, but has a thickness of 2 to 4 mm when employed in computed tomography.

A $ZnWO_4$ single crystal of high purity has to be grown in order to obtain a single crystal having such a low absorption coefficient for light as being suited to a scintillator according to the present invention. In more detail, the above single crystal is grown from molten $ZnWO_4$ through conventional techniques such as the Czochralski technique and the zone melting method. In a case where the Czochralski technique is employed, the purity of the grown single crystal can be enhanced by applying an electric field across the growth interface in such a manner that the crystal and the crucible are used as an anode and a cathode, respectively, thereby a more favorable result being obtained.

A scintillator according to the present invention is fabricated as follows. A $ZnWO_4$ single crystal is cut to predetermined shape and size through well-known methods, and that surface of the single crystal thus cut, which faces the radiation receiving surface, is smoothed to a mirror surface through a well-known polishing method. The buffing is usually effected to obtain a mirror surface, but the polishing method for producing mirror surface is not limited to the buffing. Further, other surfaces of the single crystal than the mirror polished surface are changed into coarse surfaces by the grinding operation using, for example, carborundum, or into reflecting surfaces through the coating of such a reflecting material as MgO or $BaSO_4$.

The present invention will be apparent from the following detailed description taken in conjunction with the accompanying drawings, in which.

The inventors have selected zinc tungstate $ZnWO_4$ out of tungstates expressed by a general formula $MWO_4$ (where M indicates a bivalent metal), investigated various characteristics of zinc tungstate, and found a $ZnWO_4$ crystal useful to the scintillator.

It has been known that powdered zinc tungstate produces a relatively strong luminescence having a maximum intensity at a wavelength of 520 nm. However, a single crystal of zinc tungstate, which is made by the conventional method, assumes a dark reddish brown color, and has a large absorption coefficient for light within the visible wavelength range. When this single crystal is employed as a scintillator, the X-ray detection sensitivity is only about 5 percent of that of the NaI (Tl) scintillator since only the light having passed through the scintillator is used to detect X-rays. Further, the fact that the absorption coefficient is large in a visible wavelength range, has been considered to be an essential property of zinc tungstate.

The inventors have grown a large number of pure crystals from the conventional $ZnWO_4$ crystal, and measured their absorption coefficient at a wavelength of 520 nm. As a result of the above measurements, it has been found that the absorption coefficient is small as the purity of the grown crystals is higher, and that a $ZnWO_4$ crystals having an absorption coefficient not more than a specified value can be put to practical use as a scintillator.

Figure 1:
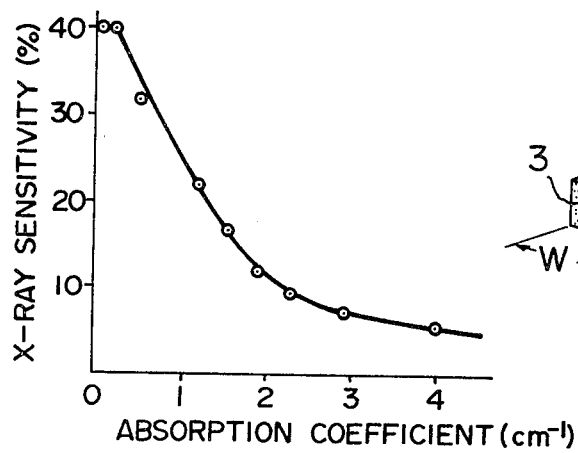
FIG. 1 is a graph showing a relation between the X-ray detection sensitivity of the scintillator formed of a $ZnWO_4$ single crystal and the absorption coefficient of the $ZnWO_4$ single crystal.

FIG. 1 shows a relation between the absorption coefficient ($cm^{-1}$) of $ZnWO_4$ crystal at a wavelength of 520 nm and the relative X-ray detection sensitivity of the detector employing $ZnWO_4$ crystal, where the X-ray detection sensitivity of the detector employing NaI (Tl) is expressed by 100%. The relation shown in FIG. 1 was obtained from experiments which employed X-rays emitted from an X-ray source having an accelerating voltage of 100 KV and including a tungsten target, and which employed $ZnWO_4$ crystals each having a thickness of 2 mm as the scintillator. As is apparent from FIG. 1, a crystal having an absorption coefficient greater than 3 $cm^{-1}$ exhibits a small X-ray detection sensitivity, that is, the detection sensitivity in this case is equal to several percent of that of the case employing NaI (Tl). A crystal having an absorption coefficient of 1.8 $cm^{-1}$ can exhibit an X-ray detection sensitivity of 12%, and therefore is equal in X-ray detection sensitivity to $Bi_4Ge_3O_{12}$ which has been used as the scintillator. Further, according as a $ZnWO_4$ crystal has an absorption coefficient of 1.2, 0.5, or 0.21 $cm^{-1}$, the X-ray detection sensitivity of a detector using the $ZnWO_4$ crystal is equal to 22%, 32%, or 40%. Furthermore, a crystal with an absorption coefficient less than 0.21 $cm^{-1}$ exhibits an X-ray detection sensitivity of 40%.

As described previously, a scintillator according to the present invention is formed of a $ZnWO_4$ single crystal having a low absorption coefficient. Such a single crystal can be obtained by enhancing the purity of the conventional $ZnWO_4$ crystal. Accordingly, all of conventional methods for enhancing the purity of crystal can be used to produce a scintillator according to the present invention.

In general, in order to improve the purity of a single crystal, the single crystal is heated to melt, and then successively solidified in a specified direction to effect crystal growth. This method is applicable to the present invention. In other words, a $ZnWO_4$ single crystal for forming a scintillator according to the present invention is obtained by growing a single crystal from a $ZnWO_4$ melt.

The Czochralski method and the zone-melting method are usually employed to grow a single crystal from a melt. It is needless to say that not only these methods but also other methods for growing a single crystal may be used in the present invention.

Further, as is well-known, in a case when a single crystal is grown from the melt of a material through the Czochralski technique, if an electric field is applied across the material in such a manner that the grown crystal and the crucible carrying the melt are used as the anode and the cathode, respectively, the purity of the grown single crystal can be improved. This method can be also used in fabricating a $ZnWO_4$ single crystal which forms a scintillator according to the present invention.

As described previously, a $ZnWO_4$ single crystal having a thickness of 2 to 4 mm is used to form a scintillator which is incorporated in computed tomography. In computed tomography, the peak energy of white X-rays lies within a range of 40 to 70 KeV, and the scintillator is required to have the above-mentioned thickness to absorb a greater part of the white X-rays. In more detail, the $ZnWO_4$ single crystal having a thickness of 4 mm can absorb more than 99.9% of incident X-rays having a peak energy of 70 KeV, and the $ZnWO_4$ single crystal having a thickness of 2 mm can absorb about 99.5% of incident X-rays having a peak energy of 40 KeV. Further, the $ZnWO_4$ single crystal must have a thickness greater than 3 mm to absorb more than 99% of incident X-rays having a peak energy of 60 KeV, which are most frequently employed in the computed tomography.

The luminescence generated in a scintillator impinges upon a photomultiplier or a photodiode to be converted into an electrical signal. That surface of the scintillator which is kept in contact with these photoelectric conversion elements, has to have a mirror surface and be flat. In the case where a $ZnWO_4$ single crystal is used to form the scintillator, a mirror polished surface is formed in the (010) plane of the crystal, since the (010) plane is a cleavage plane of the $ZnWO_4$ single crystal and can readily become a mirror surface. Accordingly, a $ZnWO_4$ single crystal which is used to form a scintillator according to the present invention, uses the (010) plane thereof as the X-ray receiving surface and the opposite surface thereto. However, other planes than the (010) plane can be smoothed to a mirror surface, if these planes are carefully polished. Accordingly, the X-ray receiving surface and the opposite surface thereto are not limited to the (010) plane. However, since the $ZnWO_4$ single crystal is easy to cleave like mica, it is difficult to polish other planes than the (010) plane without breaking the $ZnWO_4$ single crystal. In this case, therefore, the yield in fabricating process is very low.

The most general method of working a $ZnWO_4$ single crystal is as follows. The grown single crystal of $ZnWO_4$ is cut by diamond cutter along predetermined planes which are perpendicular to the X-ray receiving surface, namely, the (010) plane, and then cloven along a pair of cleavage planes by a knife edge or the like so as to have a predetermined thickness. One of the cleavage planes is smoothed to a mirror surface by a buffing machine. On the other hand, other surfaces of the crystal wafer thus obtained than the mirror polished surface are changed to rough surfaces or coated with a reflecting material, in order for the luminescence generated in the crystal wafer to impinge upon the photoelectric conversion element at a high efficiency. The rough surfaces, as is previously described, are readily obtained by grinding the crystal surface with, for example, carborundum. The roughness of the rough surfaces is made equal to, for example, about 2.5 μm, but is not limited to such a value. Incidentally, MgO, BaSO$_4$ and the like may be used as the reflecting material.

Now, various embodiments of the present invention will be described below in detail.

EMBODIMENT 1

A mixture of equal parts by mol of a 99.99% pure WO$_3$ powder and a 99.9% pure ZnO powder was charged in a Pt crucible (the total weight of these raw materials was made equal to 400 gr). These raw materials was heated to 1,100° C. in an oxygen atmosphere through the high-frequency induction heating, and a ZnWO$_4$ single crystal having a diameter of 25 mm was grown through the Czochralski technique under the conditions that the pulling rate of the grown crystal and the speed of revolution thereof were made equal respectively to 4 mm/hour and 50 rpm. The single crystal thus grown assumed slightly a brown color, exhibited an absorption coefficient of 1.8 cm$^{-1}$ for a light beam having a wavelength of 520 nm, and contained 50 ppm of impurity. The above impurity was mainly composed of Si and Ca. This ZnWO$_4$ single crystal was cut to the shape shown in FIG. 2 to form a scintillator. In more detail, the single crystal was first cut by a diamond cutter along planes 2 and 3 which were perpendicular to a plane 1, and then the plane and an opposite plane thereto were searched by the use of a knife edge. Since the plane 1 and the opposite plane were made parallel to the (010) plane, these planes could be readily cloven by the knife edge. Thus, the width W, the length L and the thickness t of the scintillator were made equal to 6.17 and 2 mm, respectively. Next, the plane 1 was smoothed to a mirror surface by a buffing machine, and other planes than the plane 1 were changed by the grinding operation using carborundum to coarse surfaces, the roughness of which was almost equal to 2.5 μm. Incidentally, an arrow 4 shown in FIG. 2 indicates a direction in which the radiation impinges upon the scintillator.

Figure 3:
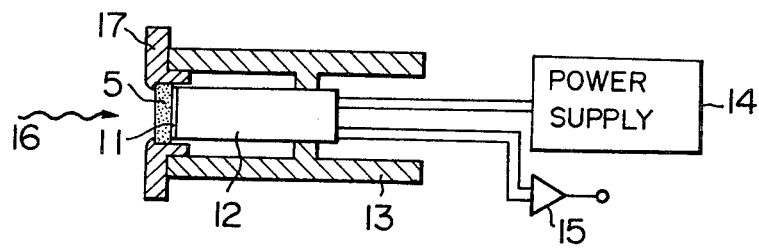
FIG. 3 is a sectional view showing a scintillation counter employing an embodiment of a scintillator according to the present invention.

As shown in FIG. 3, the surface 1 of the scintillator 5 thus formed was coated with silicon grease 11, and then brought in close contact with a photomultiplier 12. Further, a magnetic shield 13 was disposed around the photomultiplier 12, and the photomultiplier 12 was connected to a DC high voltage power supply 14 and an amplifier 15 to form a scintillation counter. Incidentally, reference numeral 17 in FIG. 3 indicates a holder of the scintillator 5.

X-rays which were emitted from an X-ray source having an acceleration voltage of 100 KV and a tungsten target, and which impinged upon the above scintillation counter in the direction of an arrow 16, were detected at a detection sensitivity of 12%. Further, in this case, the maximum luminescence wavelength was equal to 480 nm, and the afterflow detected 10 msec after was $4 \times 10^{-4}$, namely, 0.04% of the initial light output. The scintillation counter shown in FIG. 3 has the same construction as conventional ones, except that a ZnWO$_4$ single crystal is used as the scintillator.

EMBODIMENT 2

The ZnWO$_4$ single crystal obtained in Embodiment 1 and containing 50 ppm of impurity was melted, and a new single crystal was grown from the melt under the same conditions as Embodiment 1. The single crystal thus grown was transparent, had an absorption coefficient of 0.21 cm$^{-1}$, and contained 10 ppm of impurity.

The above-mentioned single crystal was shaped into a scintillator and incorporated in a scintillation counter, in a similar manner to Embodiment 1. The X-ray detection sensitivity, the luminescence wavelength, and the afterglow detected 10 msec after, which were measured by and on the scintillation counter, were 40%, 480 nm, and $4 \times 10^{-4}$, respectively.

EXAMPLE FOR REFERENCE

A mixture of equal parts by mol of a 99.9% pure WO$_3$ powder and a 99.9% pure ZnO powder was charged in a Pt crucible, and crystal growth has conducted through the Czochralski technique under the same conditions as Embodiment 1. A ZnWO$_4$ single crystal thus grown colored strongly, had an absorption coefficient of 4.0 cm$^{-1}$, and contained 120 ppm of impurity. The impurity was composed of Si, Ca and Fe. The above single crystal was shaped into a scintillator and incorporated in a scintillation counter, in a similar manner to Embodiment 1. The X-ray detection sensitivity, the luminescence wavelength, and the afterglow detected 10 msec after, which were measured by and on the above scintillation counter, were 5%, 480 nm, and $4 \times 10^{-4}$, respectively. Apparently, the above ZnWO$_4$ single crystal was very low in X-ray detection sensitivity, and therefore could not be used as the scintillator for detecting X-rays.

EMBODIMENT 3

The ZnWO$_4$ single crystal obtained in the above-mentioned Example for reference was melted, and a new single crystal was grown through the Czochralski technique under the same conditions as Embodiment 1. The single crystal thus grown had an absorption coefficient of 1.2 cm$^{-1}$, and contained 20 ppm of impurity. The above single crystal was shaped into a scintillator and incorporated in a scintillation counter, in a similar manner to Embodiment 1. The X-ray detection sensitivity, the luminescence wavelength, and the afterglow detected 10 msec after, which were measured by and on the above scintillation counter, were 22%, 480 nm, and $4 \times 10^{-4}$, respectively.

EMBODIMENT 4

The crystal growth was conducted through the Czochralski technique under the same conditions as Embodiment 1, except that a voltage was applied across the grown crystal and the ZnWO$_4$ melt in such a manner as employing the grown crystal and the crucible as the anode and the cathode, respectively, to pass a current having a current density of 0.5 mA/cm$^2$ through the grown crystal. Thus, a ZnWO$_4$ single crystal was grown which had a diameter of 25 mm, contained 34 ppm of impurity, and had an absorption coefficient of 1.3 cm$^{-1}$. That is, the absorption coefficient in this embodiment was smaller than that in Embodiment 1. The ZnWO$_4$ single crystal thus obtained was shaped into a scintillator and incorporated in a scintillation counter, in a similar manner to Embodiment 1. The X-ray detection sensitivity, the luminescence wavelength, and the afterglow detected 10 msec after, which were measured by and on the above scintillation counter, were 19%, 480 nm, and $4 \times 10^{-4}$, respectively.

EMBODIMENT 5

Equal parts by mol of a 99.99% pure $WO_3$ powder and a 99.99% pure ZnO powder were mixed, and 400 gr of the mixture was charged on a Pt boat (having external dimensions of 20 mm × 20 mm × 200 mm). A heater which had the form of a ring and was made of SiC, was disposed around the boat. The heater was heated and moved in the axial direction of the boat at a speed of 4 mm/hour so that portions having a width of 25 mm were successively melted (at a melting point of 1200° C.) in the raw material charged on the boat. Thus, a $ZnWO_4$ single crystal was grown through the zone-melting method. The grown single crystal had an absorption coefficient of 1.7 cm$^{-1}$ and contained 42 ppm of impurity.

The $ZnWO_4$ single crystal thus obtained was shaped into a scintillator and incorporated in a scintillation counter, in a similar manner to Embodiment 1. The X-ray detection sensitivity, the luminescence wavelength, and the afterglow detected 10 msec after, which were measured by and on the above scintillation counter, were 13%, 480 nm, and $4 \times 10^{-4}$, respectively.

EMBODIMENT 6

Figure 2:
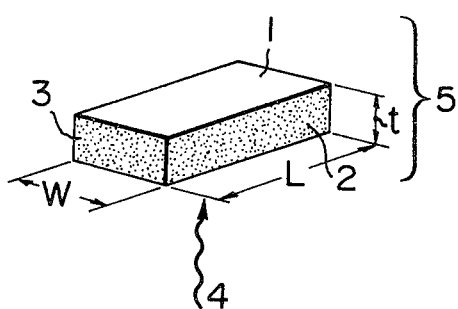
FIG. 2 is a perspective view for showing the shape of an embodiment of a scintillator according to the present invention.
Figure 4:
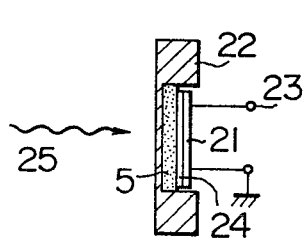
FIG. 4 is a sectional view showing another scintillation counter employing an embodiment of a scintillator according to the present invention.
Figure 5:
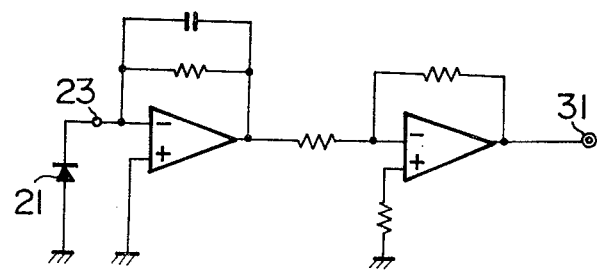
FIG. 5 is a circuit diagram showing an amplifier connected to the scintillation counter shown in FIG. 4.

The $ZnWO_4$ single crystal which was grown in Embodiment 2, was shaped into the scintillator 5 shown in FIG. 2, in a similar manner to Embodiment 1. The surface 1 of the scintillator 5 was coated with silicon grease, and then brought in close contact with a photo-diode 21. The scintillator 5 and the photo-diode 21 were mounted on an Al case 22, as shown in FIG. 4. A terminal 23 of the photo-diode 21 was connected to an amplifier circuit shown in FIG. 5 to form a scintillation counter. The photo-diode 21 was formed by a silicon wafer having a PN junction. Incidentally, an arrow 25 in FIG. 4 indicates the incident direction of radiation, and reference numeral 31 in FIG. 5 designates an output terminal.

The scintillation counter thus formed, namely, the radiation detector was incorporated in a computed tomography, and was subjected to a test for practical use. In the test, the peak voltage in signal and the noise voltage were equal respectively to 8.0 V and 620 $\mu$V. That is, a high signal-to-noise ratio was obtained. Further, the above-mentioned scintillator was also used to form a scintillation counter employing a photo-multiplier in place of the photo-diode, namely, a scintillation counter having such construction as shown in FIG. 3. The scintillation counter employing the photomultiplier was incorporated in the computed tomography, and was subjected to a test for practical use. In this test, the peak voltage in signal and the noise voltage were equal to 10 V and 720 $\mu$V, respectively. That is, a high signal-to-noise ratio was obtained in the scintillation counter employing the photomultiplier, as in the scintillation counter employing the photo-diode.

The X-ray detection sensitivity, luminescence wavelength, and afterflow detected 10 msec after of the scintillator formed of a $ZnWO_4$ single crystal, as well as the impurity content of the $ZnWO_4$ single crystal and the absorption coefficient of the $ZnWO_4$ single crystal for light having a wavelength of 520 nm, all of which have been described in each of Embodiment 1 to 5 and reference the Example, are listed in the following table 2, together with various characteristics of conventional scintillators.

TABLE 2

| Material | X-ray sensitivity (%) | Luminescence wavelength (nm) | Afterglow detected 10 msec after | Impurity content (ppm) | Absorption coefficient (cm$^{-1}$) |
| --- | --- | --- | --- | --- | --- |
| $Bi_4Ge_3O_{12}$ | 12 | 480 | $<3 \times 10^{-4}$ | | |
| $CaWO_4$ | 50 | 430 | $6 \times 10^{-4}$ | | |
| $CdWO_4$ | 65 | 480 | $6 \times 10^{-4}$ | | |
| NaI(Tl) | 100 | 410 | $13 \times 10^{-4}$ | | |
| $ZnWO_4$ (Embodiment 1) | 12 | 480 | $4 \times 10^{-4}$ | 50 | 1.8 |
| $ZnWO_4$ (Embodiment 3) | 22 | 480 | $4 \times 10^{-4}$ | 20 | 1.2 |
| $ZnWO_4$ (Embodiment 2) | 40 | 480 | $4 \times 10^{-4}$ | 10 | 0.21 |
| $ZnWO_4$ (Embodiment 4) | 19 | 480 | $4 \times 10^{-4}$ | 34 | 1.3 |
| $ZnWO_4$ (Embodiment 5) | 13 | 480 | $4 \times 10^{-4}$ | 42 | 1.7 |
| $ZnWO_4$ (Reference Example) | 5 | 480 | $4 \times 10^{-4}$ | 120 | 4 |

As is apparent from Table 2, a scintillator according to the present invention, which is formed of a $ZnWO_4$ single crystal, can exhibit a high X-ray sensitivity, when the $ZnWO_4$ single crystal has an absorption coefficient not more than 1.8 cm$^{-1}$ for light having a wavelength of 520 nm. Further, the $ZnWO_4$ single crystal is inherently excellent in luminescence wavelength and afterglow characteristic. Therefore, the scintillator according to the present invention is suitable for use in computed tomography, in respect of X-ray detection sensitivity, luminescence wavelength and afterflow characteristic. Further, the X-ray detection sensitivity of the scintillator can be further improved by using a $ZnWO_4$ single crystal having an absorption coefficient not more than 1.2 cm$^{-1}$, and more excellent scintillator can be provided.

In the foregoing description, the dependence of the light absorption coefficient of $ZnWO_4$ single crystal on the impurity content thereof has been shown. However, the impurity content is not always required to be made equal to or less than an exemplified value to obtain a desired absorption coefficient, but a $ZnWO_4$ single crystal whose impurity content is somewhat higher than the exemplified value, can exhibit an absorption coefficient nearly equal to the desired one in a case when the impurity is composed of appropriate elements. In such a case, it is needless to say that a $ZnWO_4$ single crystal having an absorption coefficient equal to or less than 1.8 cm$^{-1}$ may be used advantageously.

In the foregoing, in order to reduce the absorption coefficient of a grown single crystal, crystal growth has been repeated, or an electric field has been applied to a growth interface when a single crystal is grown through the Czochralski technique. However, such methods may be combined with each other. Needless to say, usual conditions for crystal growth may be used in addition to the exemplified conditions shown in Embodiments.

In the foregoing description, a scintillator according to the present invention has been employed in computed tomography. However, the scintillator may be used to detect γ-rays.

Obviously many modification and variations of the present invention are possible in the light of the above teachings. It is therefore to be understood that within the scope of the appended claims the invention may be practiced otherwise than as specifically described.

What is claimed is:

1. A scintillator having a zinc-tungstate single crystal as the scintillating material, said zinc-tungstate single crystal having an impurity content of not more than 50 ppm.

2. A scintillator according to claim 1, wherein said zinc-tungstate single crystal has an impurity content of not more than 20 ppm.

3. A scintillator according to claim 1, wherein said zinc-tungstate single crystal has an impurity content of not more than 10 ppm.

4. A scintillator according to claim 1, wherein a radiation receiving surface of said scintillator and an opposite surface thereto are substantially parallel to each other.

5. A scintillator according to claim 4, wherein said radiation receiving surface and said opposite surface lie in the (010) plane of said single crystal.

6. A scintillator according to claim 5, wherein said opposite surface is smoothed to a mirror surface, and each of the remaining surfaces of said scintillator is ground to a rough surface.

7. A scintillator according to claim 5, wherein said single crystal has a thickness of 2 to 4 mm.

8. A scintillation counter adapted for counting incident X-rays, comprising:

a housing having a window for receiving incident X-rays;

a scintillator crystal formed of a zinc tungstate single crystal having an impurity content of not more than 50 ppm and a thickness of 2 to 4 mm and disposed in said housing adjacent to said window for receiving incident X-rays and emitting light rays of a maximum luminescence wavelength of 480 nm; and a photo-detector disposed adjacent to the rear surface of said scintillator crystal in the housing for detecting the light rays emitted from the scintillator crystal, thereby detecting the incident X-rays.

9. A scintillation counter according to claim 8, wherein said photo-detector includes a silicon photo-diode having a PN junction therein.

10. A scintillation counter according to claim 9, wherein said photo-detector further includes an amplifier circuit.

11. A scintillation counter according to claim 8 or 9, wherein said housing includes an aluminum case having the window formed of a portion of reduced thickness.

12. A scintillation counter according to claim 8, wherein said photo-detector includes a photomultiplier.

13. A scintillation counter according to claim 8 or 12, wherein the rear surface of said scintillator crystal is coated with silicon grease and brought in close contact with the incident surface of said photo-detector.

14. In a scintillation counter for use in computed tomography using white X-rays, including a scintillator member for receiving the X-rays and emitting light rays, and a photo-detector for receiving and detecting the light rays emitted from the scintillator member, the improvement comprising:

said scintillator member being formed of a single crystal zinc tungstate containing an impurity content of not more than 50 ppm and having a thickness of 2 to 4 mm.

* * * * *